US012787687B2

(12) United States Patent
Terhorst et al.

(10) Patent No.: US 12,787,687 B2
(45) Date of Patent: Nov. 3, 2026

(54) VESSEL FOR CONTAINING PRECURSOR

(71) Applicant: ASM IP Holding B.V., Almere (NL)

(72) Inventors: Herbert Terhorst, Amersfoort (NL); Anne Geertruid Maria Spruit, Utrecht (NL); Davide Proserpio, Zeist (NL); Theodorus G.M. Oosterlaken, Oudewater (NL)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 19/079,270

(22) Filed: Mar. 13, 2025

(65) Prior Publication Data

US 2025/0293059 A1 Sep. 18, 2025

Related U.S. Application Data

(60) Provisional application No. 63/565,887, filed on Mar. 15, 2024.

(51) Int. Cl.
*H10P 72/00* (2026.01)
*C23C 16/448* (2006.01)

(52) U.S. Cl.
CPC ........ *H10P 72/0468* (2026.01); *C23C 16/448* (2013.01)

(58) Field of Classification Search
CPC . C23C 16/4481; C23C 16/08; C23C 16/4587; C23C 16/54; C23C 16/448; H10P 72/0468
See application file for complete search history.

(56) References Cited

U.S. PATENT DOCUMENTS

| | | | | |
|---|---|---|---|---|
| 7,569,191 | B2 | 8/2009 | Ganguli | |
| 8,986,456 | B2 | 3/2015 | Fondurulia | |
| 2016/0333477 | A1* | 11/2016 | Nehlsen | C23C 16/4481 |
| 2022/0195595 | A1* | 6/2022 | Zhu | C23C 16/448 |

* cited by examiner

*Primary Examiner* — P. Macade Nichols
(74) *Attorney, Agent, or Firm* — Banner & Witcoff, Ltd.

(57) ABSTRACT

A vessel for containing a precursor in liquid or solid form is disclosed. The vessel comprises an inlet port for supplying a gas to the interior of the vessel and an outlet port for removing a gas from the interior of the vessel, the inlet port and the outlet port being spaced apart in a first direction, the vessel comprising an upper interior surface and a bottom, opposite interior surface, the upper surface being arranged to face the precursor contained in the vessel in use. The vessel is shaped such that a vertical distance between a top surface of the precursor and the upper interior surface of the vessel varies between the inlet and the outlet, having a minimum value at a point located between the inlet and the outlet in the first direction.

20 Claims, 7 Drawing Sheets

VESSEL FOR CONTAINING PRECURSOR

CROSS-REFERENCE TO RELATED APPLICATION(S)

This Application claims the benefit of U.S. Provisional Application 63/565,887 filed on Mar. 15, 2024, the entire contents of which are incorporated herein by reference.

FIELD OF INVENTION

The present invention relates generally to semiconductor processing and, more particularly, to devices and methods for provision of precursors.

BACKGROUND OF THE DISCLOSURE

In the semiconductor industry, various processes are used for forming thin films of materials on substrates such as silicon wafers. In chemical vapor deposition (CVD), reactant gases, also referred to herein as precursor gases, of different reactants are delivered to one or more substrates in a reaction chamber. The reactant gases react with one another in the reaction chamber to form thin films on the one or more substrates. In an atomic layer deposition (ALD) process, gaseous precursors are supplied, alternatingly and repeatedly, to the substrate or wafer to form a thin film of material on the wafer. One reactant adsorbs in a self-limiting process on the wafer. A different, subsequently pulsed reactant reacts with the adsorbed material to form a single molecular layer of the desired material.

In some applications, the reactant gases are stored in gaseous form in a reactant source vessel. In such applications, the reactant vapors are often gaseous at ambient (i.e., normal) pressures and temperatures. Examples of such gases include nitrogen, oxygen, hydrogen, and ammonia. However, in some cases, the vapors of source chemicals ("precursors") that are liquid or solid (e.g., hafnium chloride) at ambient pressure and temperature are used. For some substances, the vapor pressure at room temperature is so low that they have to be heated to produce a sufficient amount of reactant vapor (vapor draw method).

Some precursors which are desired to be used in such thin film deposition processes have a low volatility such that even at temperatures above 100 C, the vapor pressure is not sufficient to provide the required amount of precursor for a precursor deposition step within the time allocated to the process. This can be a problem especially in applications wherein the reaction chamber contains multiple substrates having high surface enhancement, as in such cases the effective surface area on which the precursor is to be deposited can be 400 or more times higher than the surface area of a flat substrate. Maintaining the precursor in gaseous form above the vaporization temperature for long periods of time causes the precursor to decompose, making it unsuitable for use in a deposition process.

As an alternative to vapor draw, a carrier gas method can be used, in which an inert gas is brought into contact with the precursor in liquid form contained in a precursor vessel. The precursor vapor diffuses into the inert gas and is carried along with the carrier gas out of the vessel and to the reactor chamber. In direct liquid injection, small droplets of the precursor are injected into the heated carrier gas, into which the droplets evaporate and are swept along. The capacity of such a device is limited and not suitable for high surface enhancement or multiple wafer applications. In a bubbler, inert gas is injected through the liquid precursor from the bottom of the vessel, forming bubbles in the precursor. As the bubbles rise, precursor evaporates from the surface of the bubbles towards the center of the bubbles, such that once the bubbles reach the surface of the precursor, the inert gas is saturated with precursor vapor. This requires a large quantity of precursor to be provided in the vessel which can result in decomposition of unstable precursors.

A typical solid or liquid source precursor delivery system includes a solid or liquid source precursor vessel and a heating means (e.g., radiant heat lamps, resistive heaters, etc.). The vessel includes the solid (e.g., in powder form) or liquid source precursor. The heating means heats up the vessel to increase the vapor pressure of precursor gas in the vessel. The vessel has an inlet and an outlet for the flow of an inert carrier gas (e.g., N2) through the vessel. The carrier gas sweeps precursor vapor along with it through the vessel outlet and ultimately to a substrate reaction chamber. The vessel typically includes isolation valves for fluidly isolating the contents of the vessel from the vessel exterior. Ordinarily, one isolation valve is provided upstream of the vessel inlet, and another isolation valve is provided downstream of the vessel outlet. Precursor source vessels are normally supplied with tubes extending from the inlet and outlet, isolation valves on the tubes, and fittings on the valves, the fittings being configured to connect to the gas flow lines of the remaining substrate processing apparatus.

SUMMARY OF THE DISCLOSURE

According to a first aspect of the present invention, there is provided a vessel for containing a precursor in liquid or solid form, the vessel comprising an inlet port for supplying a gas to the interior of the vessel and an outlet port for removing a gas from the interior of the vessel, the inlet port and the outlet port being spaced apart in a first direction, the vessel comprising an upper interior surface and a bottom, opposite interior surface, the upper surface being arranged to face the precursor contained in the vessel in use, wherein the vessel is shaped such that a vertical distance between a top surface of the precursor and the upper interior surface of the vessel varies between the inlet and the outlet, having a minimum value at a point located between the inlet and the outlet in the first direction.

It is an advantage of embodiments of the present invention that a vessel can be provided which can provide substantially full saturation of a carrier gas flowing through the vessel with precursor gas.

The minimum value point may be located at a midpoint between the inlet and the outlet in the first direction.

The upper interior surface may have a spherical shape. The upper interior surface may have a conical shape.

The vessel may be formed such that the vertical distance between a top surface of the precursor and the upper interior surface of the vessel increases along the first direction from the minimum point towards the inlet or outlet.

The vessel may be formed such that the vertical distance between the top surface of the precursor and the top interior surface of the vessel increases in any direction directed away from the minimum point. The vertical distance may increase continuously in any direction directed away from the minimum point. The vertical distance may increase in a step-wise manner in any direction directed away from the minimum point.

The upper interior surface may comprise a flat section centered on the minimum point, wherein the width of the flat section is less than two thirds the distance between the inlet and the outlet.

The width of the vessel may be less than two times the distance between the inlet and the outlet.

The vessel may be cylindrical in shape and the minimum point may be located on the axis of the cylinder.

The vessel may comprise a receptacle for containing the precursor in solid or liquid form and a lid which is removably attached to the receptacle, wherein the upper interior surface of the vessel is a lower surface of the lid.

The inlet port and the outlet port may be provided in the lid.

The inlet port and the outlet port may be provided in a wall of the receptacle.

At least one of the inlet port and the outlet port may have a slit shape, the width of the slit being greater than its height.

At least one of the inlet port and the outlet port may comprise a plurality of holes arranged within a slit shape.

The vessel may comprise side walls and a base, and a vertical distance between the upper interior surface of the vessel and the base of the vessel may vary between a maximum and a minimum, and the height of the side walls may be at least 1.5 times the difference between the maximum vertical distance and the minimum vertical distance.

The height of the side walls may be less than ten times the difference between the maximum vertical distance and the minimum vertical distance.

The width of the vessel may be at least five times a height of the vessel.

The width of the vessel may be at least ten times a height of the vessel.

The width of the vessel may be approximately the same as the height of the vessel. This can allow for a large precursor supply to be provided.

The vessel may further comprise one or more heating elements for heating the vessel and/or a precursor which may be contained in the vessel.

According to a second aspect of the present invention there is provided a method of providing a carrier gas which is substantially saturated with a precursor gas, the method comprising providing a vessel according to the first aspect, providing a precursor in solid or liquid form in the vessel, and flowing a carrier gas from the inlet to the outlet.

The vessel may comprise one or more heating elements and the method may comprise using one or more heating elements to heat the precursor contained in the vessel before and/or while the carrier gas is flowed from the inlet to the outlet.

According to a third aspect of the present invention, there is provided a lid for a vessel for containing a precursor in liquid or solid form, the lid comprising an inlet port for supplying a gas to the interior of the vessel and an outlet port for removing a gas from the interior of the vessel, the inlet port and the outlet port being spaced apart in a first direction, the lid comprising an upper surface and a lower surface, the lower surface being arranged to face the precursor contained in the vessel in use, wherein the lid is shaped such that a vertical distance between a top surface of the precursor and the lower surface of the lid varies between the inlet and the outlet, having a minimum value at a point located between the inlet and the outlet in the first direction.

It is an advantage of embodiments of the present invention that a lid can be provided which can provide substantially full saturation of a carrier gas flowing through a vessel, to which the lid is attached, with precursor gas.

The minimum value point may be located at a midpoint between the inlet and the outlet in the first direction.

The lower surface may have a spherical shape. The lower surface may have a conical shape.

The lid may be formed such that the vertical distance between a top surface of the precursor and the lower surface of the lid increases along the first direction from the minimum point towards the inlet or outlet.

The lid may be formed such that the vertical distance between the top surface of the precursor and the lower surface of the lid increases in any direction directed away from the minimum point. The vertical distance may increase continuously in any direction directed away from the minimum point. The vertical distance may increase in a step-wise manner in any direction directed away from the minimum point.

The lower surface may comprise a flat section centered on the minimum point, wherein the width of the flat section is less than two thirds the distance between the inlet and the outlet.

The width of the lid may be less than two times the distance between the inlet and the outlet.

At least one of the inlet port and the outlet port may have a slit shape, the width of the slit being greater than its height.

At least one of the inlet port and the outlet port may comprise a plurality of holes arranged within a slit shape.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

Certain embodiments of the present invention will now be described, by way of example, with reference to the accompanying drawings, in which:

FIG. 1*a* is a plan view of a lid of a vessel according to embodiments of the present invention viewed towards the upper surface of the lid;

FIG. 1*b* is a perspective cross-sectional view of a section of the lid of FIG. 1*a;*

FIG. 1*c* is a cross-sectional view of the lid of FIG. 1*a* taken along the line A-A;

FIG. 2*a* is a cross-sectional view in a vertical plane of a vessel according to embodiments of the present invention;

FIG. 2*b* is a cross-sectional view in a vertical plane of a vessel according to embodiments of the present invention which contains a precursor;

FIG. 2*c* is a cross-sectional view in a vertical plane of a vessel according to embodiments of the present invention, having an upper interior surface with an offset spherical shape;

FIG. 2*d* is a cross-sectional view in a vertical plane of a vessel according to embodiments of the present invention, showing gas flow paths through the vessel;

FIG. 3*a* is a cross-sectional view in a vertical plane of a comparative example of a precursor container which is not included in the present invention;

FIG. 3*b* is a plan view of a lid of the precursor container shown in FIG. 3*a;*

Figure 1A:
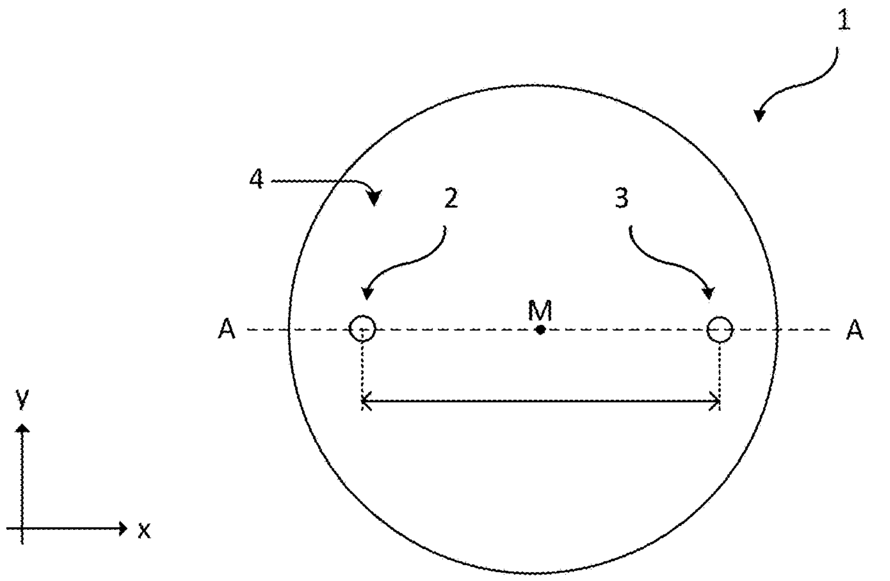

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

Figure 1B:
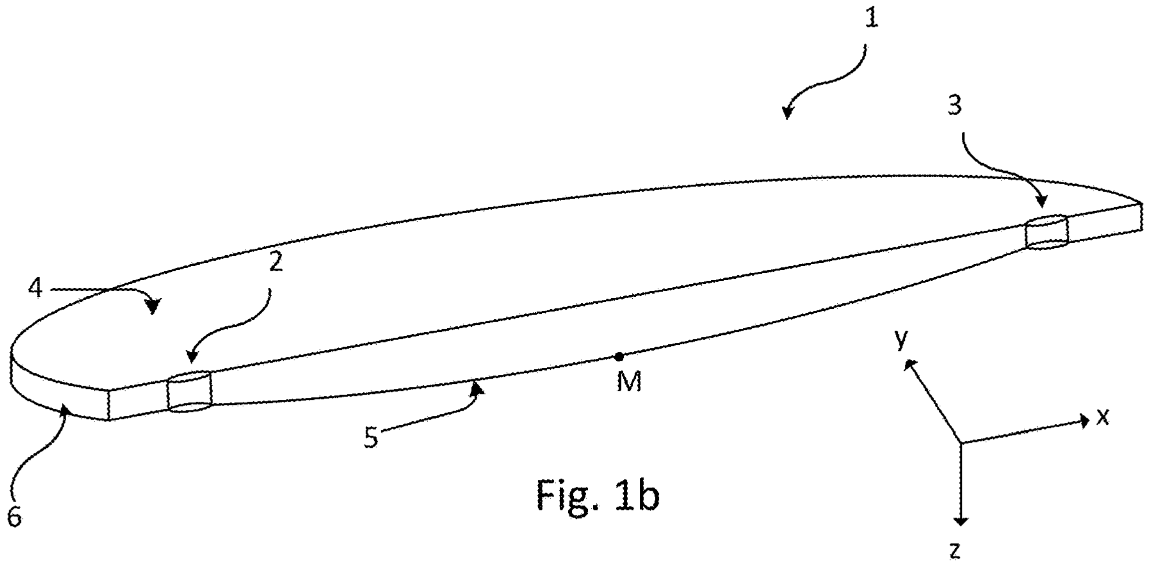
Figure 1C:
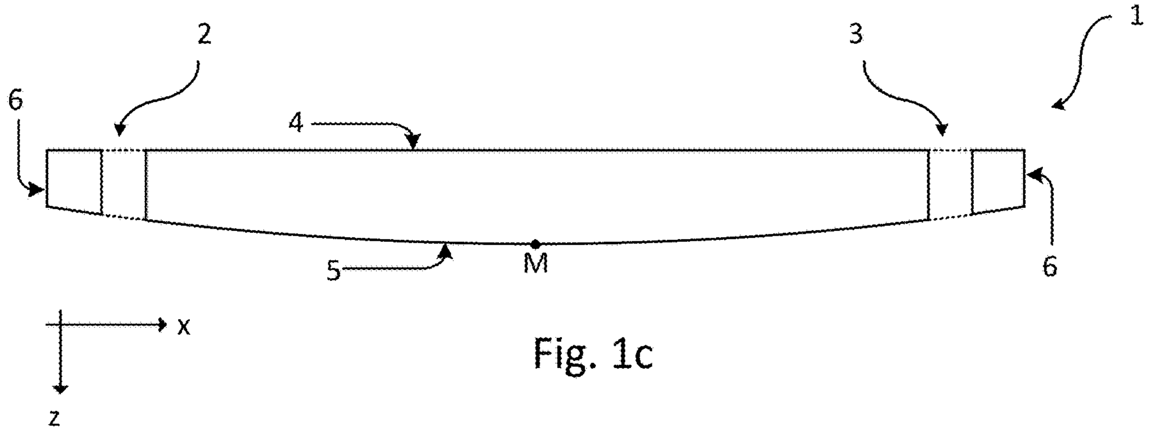

Referring to FIGS. 1*a* to 1*c*, a lid 1 according to embodiments of the present invention is shown. As will be described in more detail hereinafter, the lid 1 may be comprised in a vessel 20 (FIG. 2) for containing a precursor in solid or liquid form. The lid 1 comprises an inlet port (or inlet) 2, and an outlet port (or outlet) 3. The inlet port 2 and the outlet port 3 are spaced apart in a first direction x. The lid 1 has an upper surface 4, a lower surface 5, and a side surface 6 extending between the upper surface 4 and the lower surface 5. In some embodiments, the upper surface 4 is substantially planar, however, the present invention is not limited thereto and the upper surface 4 may in some embodiments comprise non-planar portions. A midpoint between the inlet port 2 and the outlet port 3 in the first direction, the midpoint being located on the lower surface 5, is denoted M.

The inlet port 2 and the outlet port 3 may each provide a conduit through the lid 1 by connecting the upper surface 4 and the lower surface 5. The inlet port 2 is configured to allow a carrier gas, or inert gas, to be introduced into a vessel 20 (FIG. 2) in which the lid 2 is comprised. The outlet port 3 is configured to allow gases to exit the vessel therethrough. In some embodiments, the inlet port 2 and the outlet port 3 may extend along a z direction being perpendicular to the first direction x.

In some embodiments, the lid 1 may be generally circular in shape as viewed in a direction towards the upper surface 4, however, the present invention is not limited to generally circular shaped lids. The lid 1 may in some embodiments be elliptical in shape. In some embodiments, the lid 1 may be square or rectangular in shape or have a different shape.

Figure 2A:
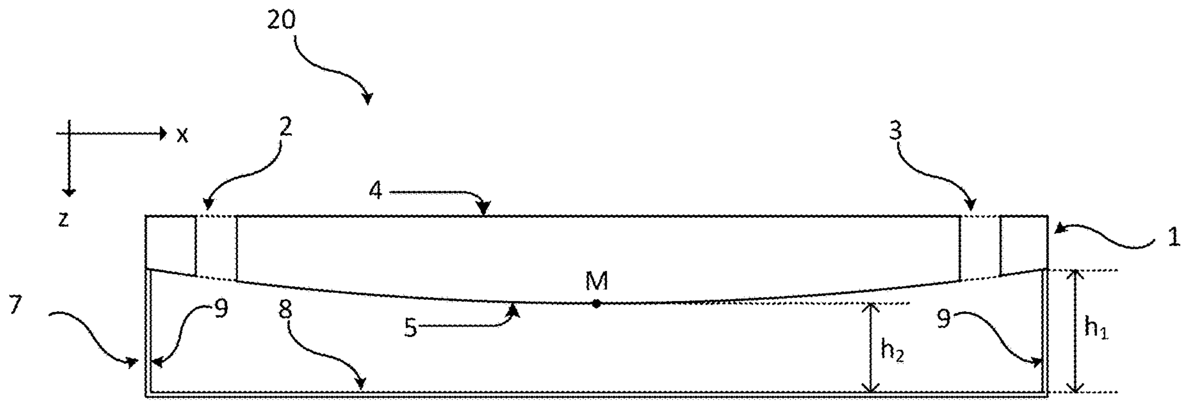
Figure 2B:
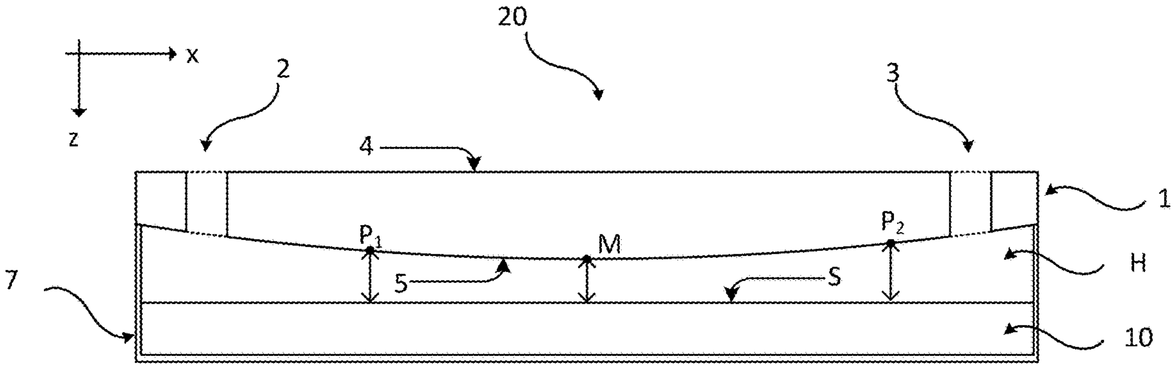

Referring now to FIGS. 2*a* and 2*b*, the lid 1 is removably attachable to a precursor supply receptacle 7. The lid 1 and receptacle 7 together form a vessel 20. The receptacle 7 comprises a base 8 and side walls 9 extending upwards from the base 8 and is configured to contain a precursor 10 in solid or liquid form having a surface S. The volume between the surface S of the precursor 10 and the lower surface 5 (also referred to as an upper interior surface of the vessel 20) of the lid 1 is known as the headspace H. When the lid 1 is removably attached to the receptacle 7, a seal (not shown) may be disposed between the lid 1 and the receptacle 7 to ensure that contents of the receptacle are secured therein. In one embodiment, the seal may be an o-ring that is disposed within a groove (not shown) formed in the receptacle 7. In another embodiment, the seal may be formed as a metal gasket or a v-seal that is configured to be disposed between the receptacle 7 and the lid 1.

In some embodiments, the lid 1 and receptacle 7 are formed from the same material so that both components have substantially the same thermal conductivity and the same coefficient of thermal expansion therebetween. In some embodiments, the receptacle 7 is formed of a material different than the material used to form the lid 1. In some embodiments, the receptacle 7 and the lid 1 are formed of stainless steel. In other embodiments, the receptacle 7 and/or lid 1 may be formed of high nickel alloys, aluminum, or titanium. It should be understood by one of ordinary skill in the art that the receptacle 7 and the lid 1 can be formed of any other material sufficient to allow sufficient thermal heat transfer to vaporize the precursor disposed within the receptacle 7 while being inert, or not reacting with the precursor or contents within the receptacle 7; and being strong enough to withstand pressure difference between the inside of the vessel and the outside.

Figure 3A:
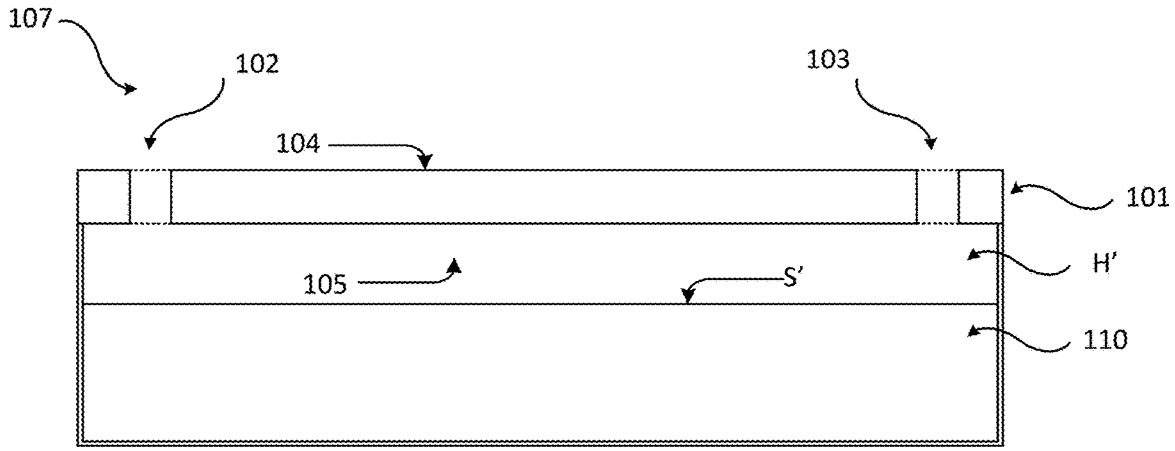

Referring to FIG. 2*b*, the lid 1 may be shaped such that the vertical distance, i.e. distance in the z direction, between the lower surface 5 (also referred to as the upper interior surface of the vessel 20) and the surface S of the precursor 10, the surface S being a plane located below the lower surface 5 of the lid 1 and having the z direction as its normal, is not constant over the lower surface 5. The lid 1 may be shaped such that the vertical distance at the midpoint M is less than the vertical distance at a first point $P_1$ located closer to the inlet than to the outlet and is less than the vertical distance at a second point $P_2$ located closer to the outlet than to the inlet. In some embodiments, this condition may be satisfied by a lid 1 with a lower surface 5 having a spherical dome shape wherein the center of the sphere of which the dome is a section is located on the same side of the lid 1 as the upper surface 4. In some embodiments, the condition may be satisfied by a lid 1 with a lower surface 5 having a conical shape (FIG. 3*a*). The lid 1 according to embodiments of the present invention therefore forms a headspace H which is not cylindrical in shape and which instead is taller around the circumference or edge of the lid than towards the midpoint.

Figure 2C:
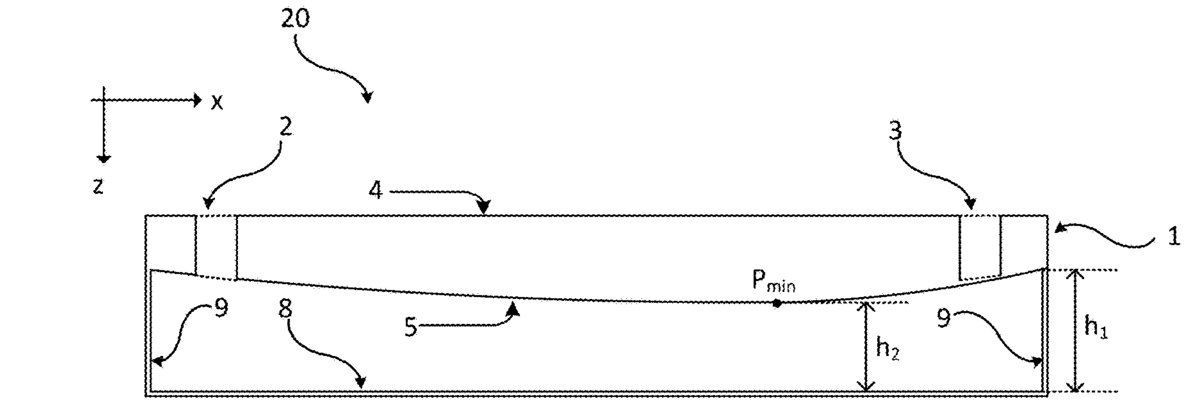

Referring to FIG. 2*c*, in some embodiments the lid 1 (or upper interior surface of the vessel) is shaped such that the vertical distance between a top surface of the precursor and the upper interior surface of the vessel varies between the inlet and the outlet, having a minimum value at a minimum point $P_{min}$ located between the inlet port 2 and the outlet port 3 in the first direction, where the minimum point is not necessarily the midpoint between the inlet port 2 and outlet port 3. For example, the lid 1 (or upper interior surface of the vessel) may have an offset spherical shape, or an offset conical shape. The lid 1 (or upper interior surface) may be shaped such that the vertical distance at the minimum point $P_{min}$ is less than the vertical distance at a third point $P_3$ located between the minimum point and the inlet in the first direction, and is less than the vertical distance at a fourth point $P_4$ located between the minimum point and the outlet in the first direction.

Figure 2D:
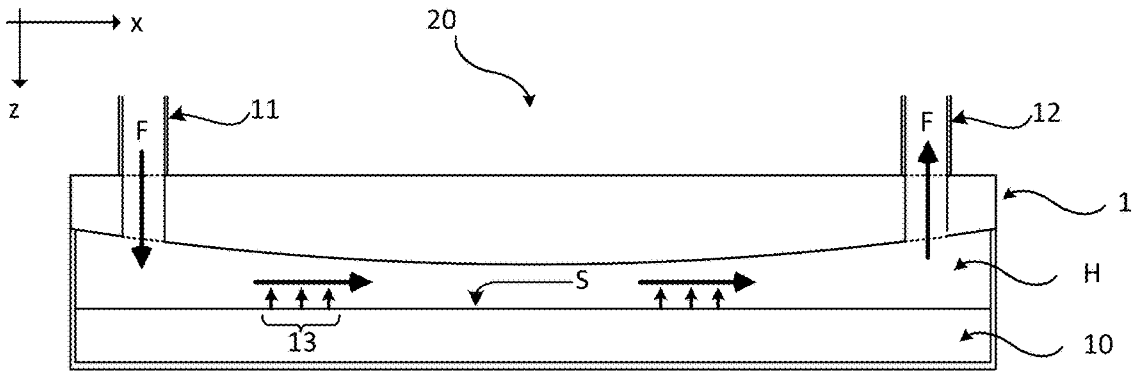

Referring to FIG. 2*d*, the inlet and outlet ports 2, 3 are configured to allow respective inlet and outlet gas lines to be coupled thereto. For example, in some embodiments, an inlet gas line 11 may be welded to the inlet port 2. In some embodiments, an outlet gas line 12 may be welded to the outlet port 2. The inlet and outlet gas lines may comprise respective valves (not shown) for controlling inlet/outlet gas flow. The skilled person will recognize that various means of attaching gas lines to the inlet and outlet ports 2, 3 are possible, such as (but not limited to) providing an interface component at the inlet/outlet port configured to attach to a valve assembly.

Referring still to FIG. 2*d*, a gas flow path F from inlet to outlet port may proceed as follows. A carrier or inert gas is flowed through the inlet port 2 into the interior of the vessel 20, for example by opening a valve (not shown) located upstream of the inlet port 2. Just before entering the inlet port 2, the saturation of the carrier gas with respect to the precursor gas may be substantially 0%. In some embodiments, just before entering the inlet port 2, the saturation of the carrier gas with respect to the precursor gas may be non-zero. For example, two or more vessels 20 may be provided wherein the outlet port 3 of a first vessel is in fluid connection with the inlet port 2 of a second vessel. In such an arrangement, the gas entering the inlet port 2 of the second vessel may have a saturation with respect to the precursor gas which is not zero. As the carrier gas flows along the surface S of the precursor 10, precursor vapor 13 diffuses into the carrier gas and the mixture of carrier gas and precursor gas is drawn towards the outlet port 3. The saturation of the carrier gas at a specific position along a gas flow path from the inlet port 2 to the outlet port 3, relative to the saturation of the carrier gas at the inlet port 2, increases with increasing time spent flowing along the surface of the precursor 10. The time spent by a gas in travelling from the inlet port 2 to the outlet port 3 is referred to as the residence time. The gas exiting the outlet port 3 is thus a mixture of carrier gas and precursor gas. The saturation of the carrier gas with respect to the precursor gas at a particular temperature T is given by the partial pressure of the precursor gas divided by the vapor pressure of the precursor at that temperature. Full (100%) saturation is reached when the partial pressure is equal to the vapor pressure.

Figure 3B:
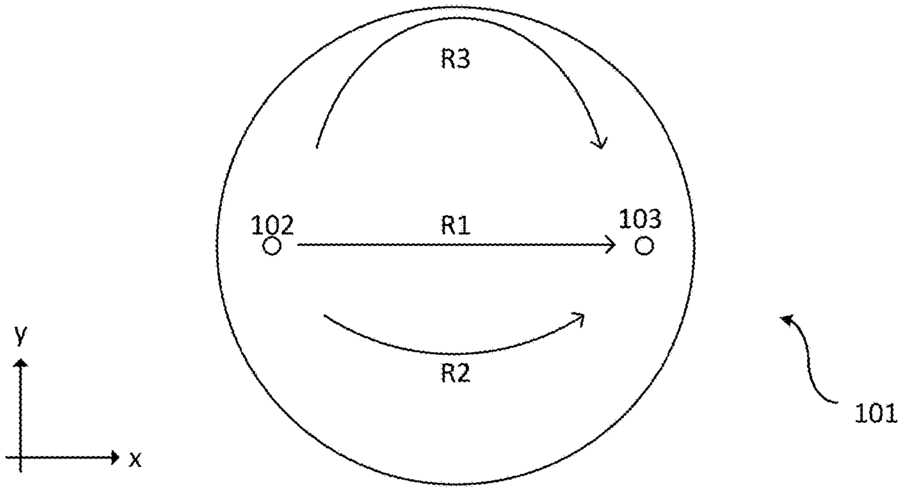

FIGS. 3*a* and 3*b* illustrate a comparative example of a receptacle 107 with a lid 101 not comprised in the present invention. The 101 has an upper surface 104 and a lower surface 105 which are planar and parallel. An inlet port 102 provides gas into the interior of the vessel 107 and an outlet port 103 allows gases to exit the receptacle 107. The inlet port 102 and the outlet port 103 are separated in a first direction x'. The lid 101 is circular in shape. The receptacle 107 holds precursor 110 having a surface S' which is planar and parallel to the lower surface 105. The headspace H' is cylindrical in shape. A gas flowing through the inlet port 102 into the receptacle 107 may take various paths from the inlet 102 to the outlet 103. A gas flow following a path R1 which is substantially a straight line from the inlet 102 to the outlet 103 will have a residence time which is less than that of a gas flow following a path R2 which is curved with respect to R1 or of a gas flow following a path R3 which substantially follows the circumference of the vessel from the inlet 102 to the outlet 103. Thus a gas flow along R1 will have a lower saturation of precursor vapor at the outlet 103 than a gas flow along R2. This nonuniform distribution of residence times depending on the flow path taken results in the gas at the outlet 103 not being fully saturated with precursor vapor, which reduces the efficiency of a semiconductor process for which the gas is to be used.

Referring now to FIG. 2*d*, in embodiments of the present invention, by providing a vessel 20 having an upper interior surface 5, for example a lower surface 5 of a lid 1, with a shape which forms a headspace H which is not cylindrical but is instead taller towards the circumference than towards the center of the vessel 20, the saturation of the carrier gas with respect to the precursor at the outlet port 3 can be made substantially equal for all flow paths from the inlet port 2 to the outlet port 3. Towards the center of the vessel 20, where the gas flow paths have a shorter residence time in the case of a cylindrical headspace, the decreased height of the headspace H provided by a vessel 20 according to embodiments of the present invention causes a reduced conductance and thus a longer residence time. The vessel 20 may thus in some embodiments have an upper interior surface 4—which may be the lower surface of the lid 1—shaped so as to provide a headspace H for which the distribution of residence times for the various possible flow paths is substantially uniform. This can help to provide a gas at the outlet port 3 which has a saturation of at least 95% with precursor gas, preferably at least 97%. A computational fluid dynamics based simulation was carried out to simulate the saturation of precursor gas along various gas flow paths for a vessel according to embodiments of the present invention by computing three aspects: the flow (distribution) from inlet port to outlet port, the evaporation rate (based on the driving force: precursor vapor pressure at the solid/liquid surface and the precursor partial pressure in the gas phase just above the surface), and transport (diffusion) in the gas flow.

Figure 5:
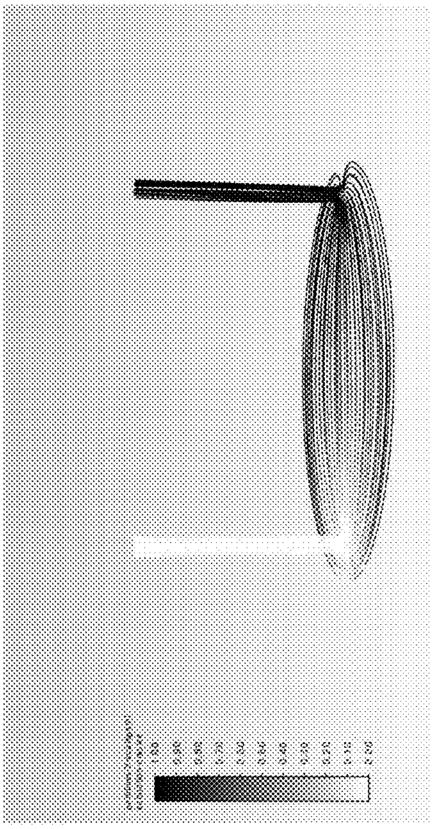
FIG. 5 illustrates gas flow paths for the precursor container shown in FIG. 3*a;*
Figure 4:
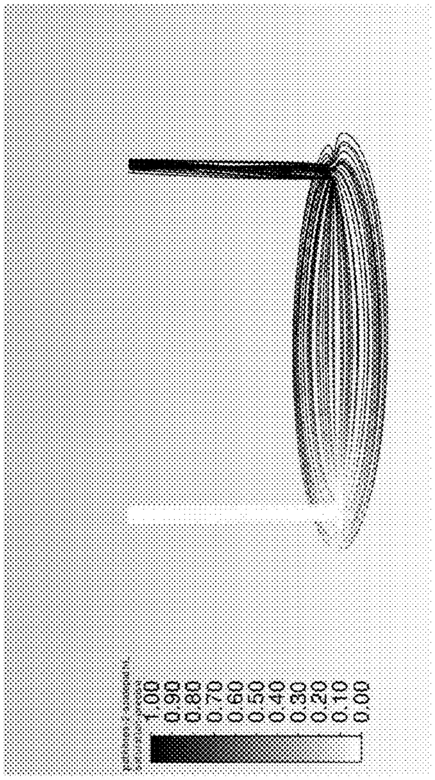
FIG. 4 illustrates gas flow paths from inlet to outlet for a vessel according to embodiments of the present invention. The lines drawn represent the flow paths taken and the shading level of the lines at any point represents the precursor gas saturation at that point.

The vessel simulated comprised a lid with a lower surface having a spherical shape as described in relation to FIGS. 1 and 2. The maximum vertical distance from the surface of the precursor to the lower surface of the lid was 5 mm and the minimum vertical distance from the surface of the precursor to the lower surface of the lid, as measured at the midpoint, was 2.5 mm. The maximum width, i.e. the diameter of the vessel was 200 mm. As a comparative example, gas flow paths were simulated for a vessel of the same dimensions and a lid having a planar lower surface with a constant vertical distance of 3.75 mm from the surface of the precursor to the lower surface of the lid. In each example, the depth of precursor contained in the vessel was 15 mm. It can be seen from FIG. 4 that the saturation increases at substantially the same rate along the different gas flow paths from inlet to outlet in the vessel according to embodiments of the present invention, such that the saturation of all flow paths at the outlet is substantially equal. Referring to FIG. 5, for the comparative example, the saturation of the different flow paths at the outlet varies. The average saturation at the outlet was calculated to be 94.5% for the comparative example and 98.5% for the precursor source assembly according to embodiments of the present invention.

Referring again to FIG. 2*a*, in some embodiments the vessel 20 has dimensions such that a vertical distance between the lower surface 5 of the lid 1, or upper interior surface 5 of the vessel 20, and the base 8 of the vessel 20 varies between a maximum $h_1$ and a minimum $h_2$, wherein the maximum vertical distance $h_1$ (for example, the height of the side walls 9) is between 1.5 and five times the difference between the maximum $h_1$ and the minimum $h_2$. By providing a vessel 20 with such dimensions, the height of the headspace H can be confined within a limited range and having a non-cylindrical shape such that the residence time of the carrier gas along various flow paths can be modified, so as to result in substantially all of the gas phase being saturated by the time it reaches the outlet port 3.

In some embodiments, the vessel may be dimensioned so as to have a width which is at least five times a height of the vessel, preferably at least ten or more times a height of the vessel. In some embodiments, the vessel may be dimensioned to have a width which is at least five times an average height of the headspace, preferably at least ten or more times the average height of the headspace. The width may be less than 100 times the average height of the headspace. This can help to provide a large surface area for pickup of precursor by the carrier gas. In embodiments wherein the inlet port and outlet port are located in the lid 1 or the upper interior surface of the vessel 20, the width of the vessel 20 may be less than two times the distance between the inlet and the outlet.

Figure 6:
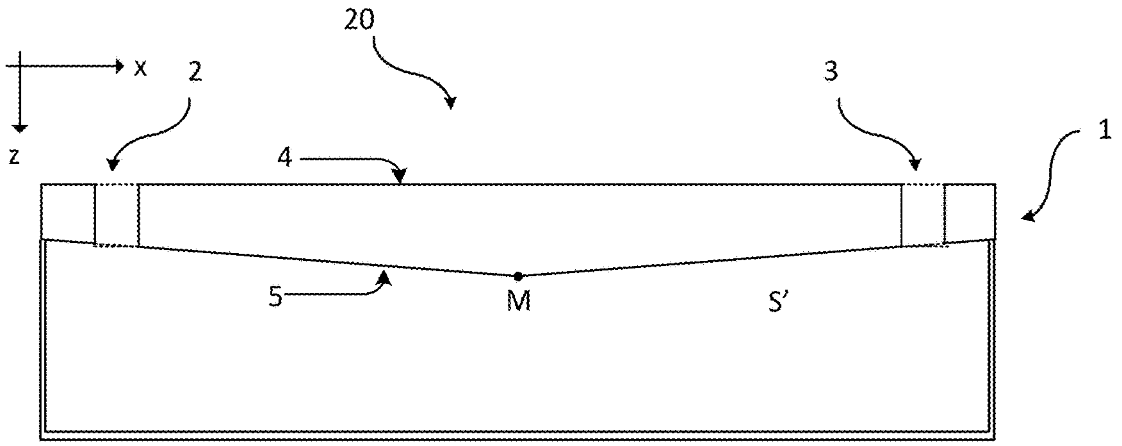
FIG. 6 is a cross-sectional view in a vertical plane of a vessel according to embodiments of the present invention having an upper interior surface with a conical shape.
Figure 7:
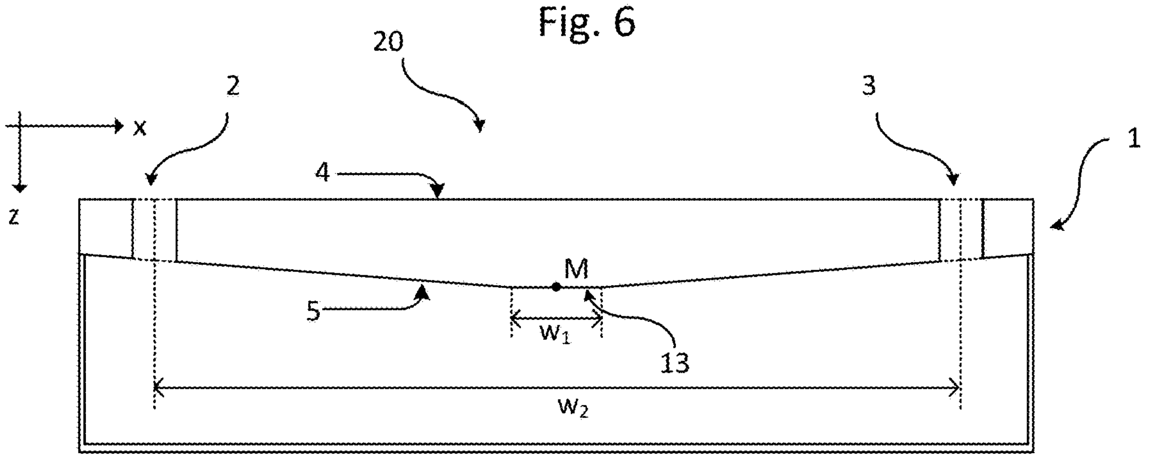
FIG. 7 is a cross-sectional view in a vertical plane of a vessel according to embodiments of the present invention having an upper interior surface with a conical shape and a flat section.

Referring to FIG. 6, in some embodiments the lower surface 5 of the lid 1, or the upper interior surface of the vessel 20, may have a conical shape with apex at the midpoint M, or at the minimum point $P_{min}$, wherein the vertical distance between the lower surface 5 and the precursor surface S increases in a direction directed from the midpoint M (or minimum point $P_{min}$) towards the edge of the lid 1. Referring to FIG. 7, in some embodiments (shown here in relation to a conical shaped lower surface but applicable to lids having other shapes e.g. spherical), the lower surface 5 comprises a flat section 13 centered on the midpoint and substantially parallel to the surface S of the precursor, wherein the width $w_1$ of the flat section is less than two thirds the distance $w_2$ between the inlet and the outlet. The flat section may be circular in shape. In some embodiments, the lower surface 5 comprises a flat section not necessarily centered on the midpoint M and all points on the flat section can be considered to be a minimum point $P_{min}$.

Figure 8:
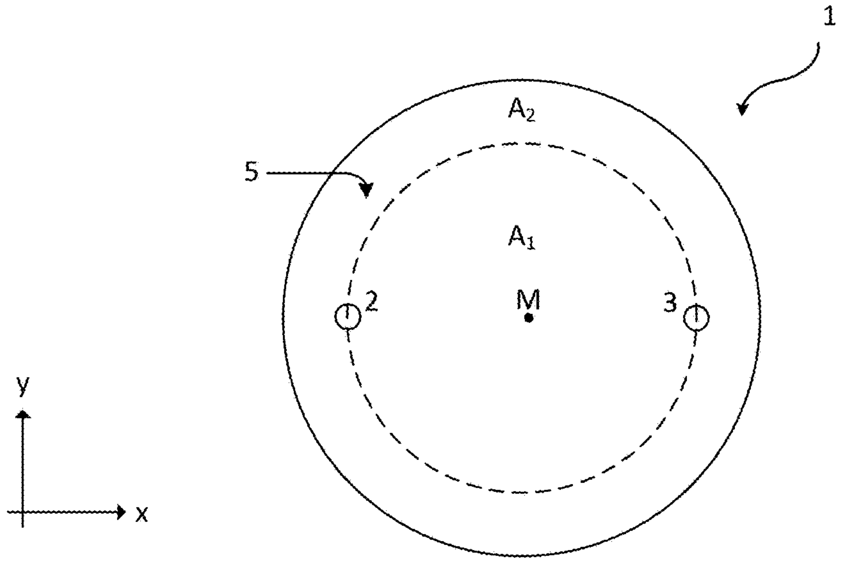
FIG. 8 is a plan view of an upper interior surface of a vessel according to embodiments of the present invention.

In some embodiments the vessel 20 may be shaped such that the vertical distance between the surface S of the precursor 10 and the lower surface 5 of the lid 1 (or upper interior surface of the vessel) increases along the first direction from the midpoint M, or minimum point $P_{min}$, towards the inlet port 2 or outlet port 3. In some embodiments, the vessel 20 may be shaped such that the vertical distance between the surface S of the precursor 10 and the lower surface 5 of the lid 1 (or upper interior surface of the vessel) increases continuously in any direction directed away from the midpoint M (or minimum point $P_{min}$) towards the side surface, or edge, 6 of the lid 1, or side edge of the vessel 20, measured in a horizontal plane. The vertical distance may increase continuously, for example as in the embodiment described hereinbefore with reference to FIG. 2*a*. In some embodiments, the vertical distance may increase in a step wise manner. In some embodiments, the vertical distance may increase continuously in some areas of the lower surface 5 (or upper interior surface) and in a step-wise manner in other areas of the lower surface 5. Referring to FIG. 8, in some embodiments, the vessel 20 may be shaped such that the lower surface 5 of the lid 1, or upper interior surface of the vessel 20, has two regions, a first region $A_1$ being the region enclosed by a circle centered on the midpoint and having the inlet port 2 and the outlet port 3 on its circumference, and a second region $A_2$ being the remainder of the lower surface 5. The lower surface 5 may be shaped such that the vertical distance between the surface S of the precursor 10 and the lower surface 5 of the lid 1 increases continuously in any direction directed away from the midpoint towards the side surface, or edge, 6 of the lid 1, within the first region $A_1$ and within the region $A_2$. The lower surface 5 may be shaped such that the vertical distance between the surface S of the precursor 10 and the lower surface 5 of the lid 1 increases continuously in any direction directed away from the midpoint towards the side surface, or edge, 6 of the lid 1, within the first region $A_1$, and such that the vertical distance between the surface S of the precursor 10 and the lower surface 5 of the lid 1 is constant within the second region $A_2$.

Figure 9:
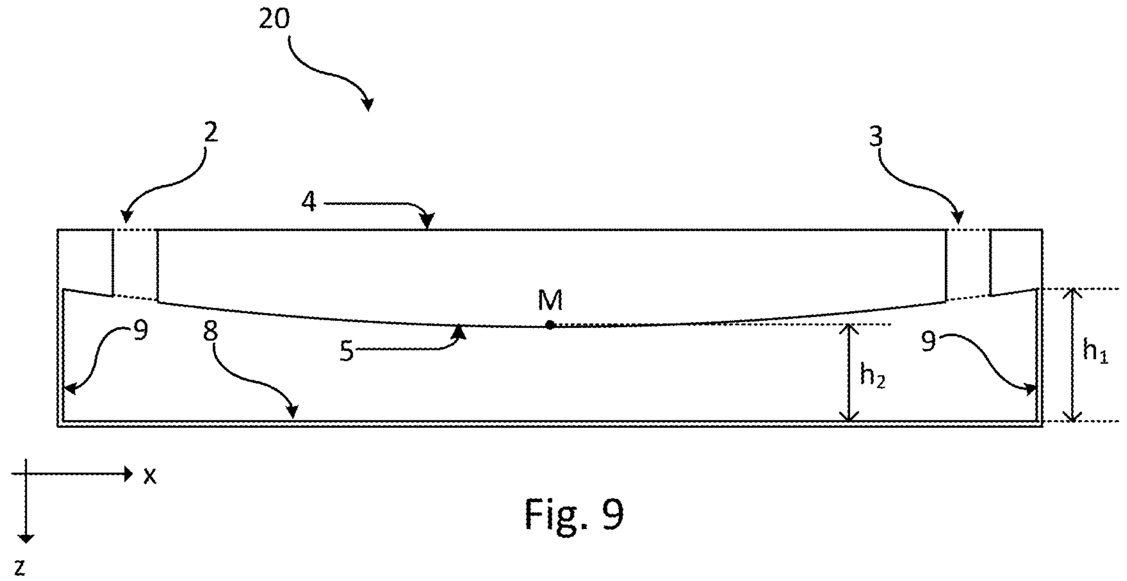
FIG. 9 is a cross-sectional view in a vertical plane of a vessel according to embodiments of the present invention which does not comprise a removably attached lid.

Referring to FIG. 9, in embodiments of the present invention, the vessel 20 does not comprise a removably attached lid 1 and may be a closed vessel having side walls 9 extending between an upper interior surface 5 and a base 8. The upper interior surface 5 may have the same properties as the lower surface 5 of the lid 1 as described herein. The vessel 20 has an upper exterior surface 4 which may have the same properties as the upper surface 4 of the lid 1 as described herein.

Figure 10:
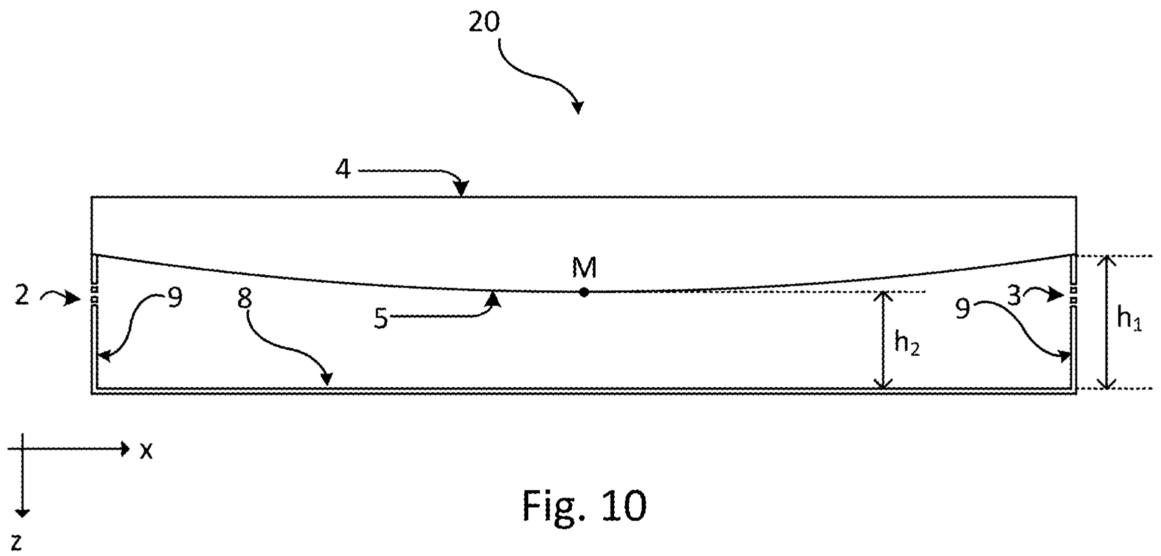
FIG. 10 is a cross-sectional view in a vertical plane of a vessel according to embodiments of the present invention wherein the inlet and outlet ports are provided in a side wall of the vessel.
Figure 11:
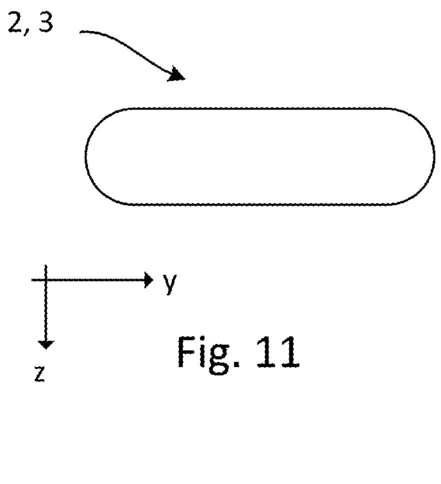
FIG. 11 is a schematic representation of a slit shaped inlet or outlet port.
Figure 12:
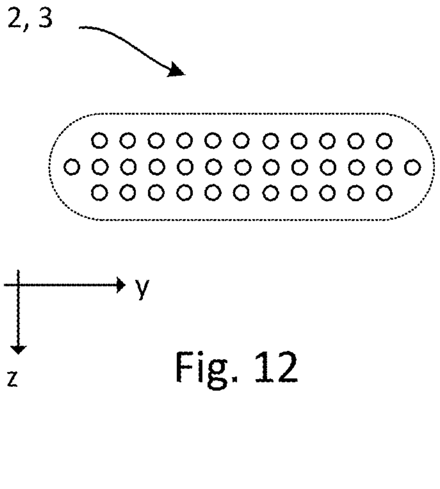
FIG. 12 is a schematic representation of an inlet or outlet port comprising a plurality of holes arranged in a slit shape.

Referring to FIG. 10, in embodiments of the present invention, a vessel 20, which may be closed as described in relation to FIG. 9 or may comprise a lid 1 and receptacle 7 as described hereinbefore, may have the inlet port 2 and outlet port 3 located on the side wall 9 of the vessel 20 and not through on the lid 1 or top surfaces 4, 5 of the vessel 20. The inlet port 2 and the outlet port 3 may be located at diametrically opposite positions and at the same height. The inlet port 2 and outlet port 3 may each comprise a single hole. Referring to FIG. 11, the inlet port 2 and outlet port 3 may each be slit shaped, having a height in the vertical direction which is less than a width in a horizontal plane. Referring to FIG. 12, the inlet port 2 and outlet port 3 may comprise a plurality of holes arranged in a slit shape.

Figure 13:
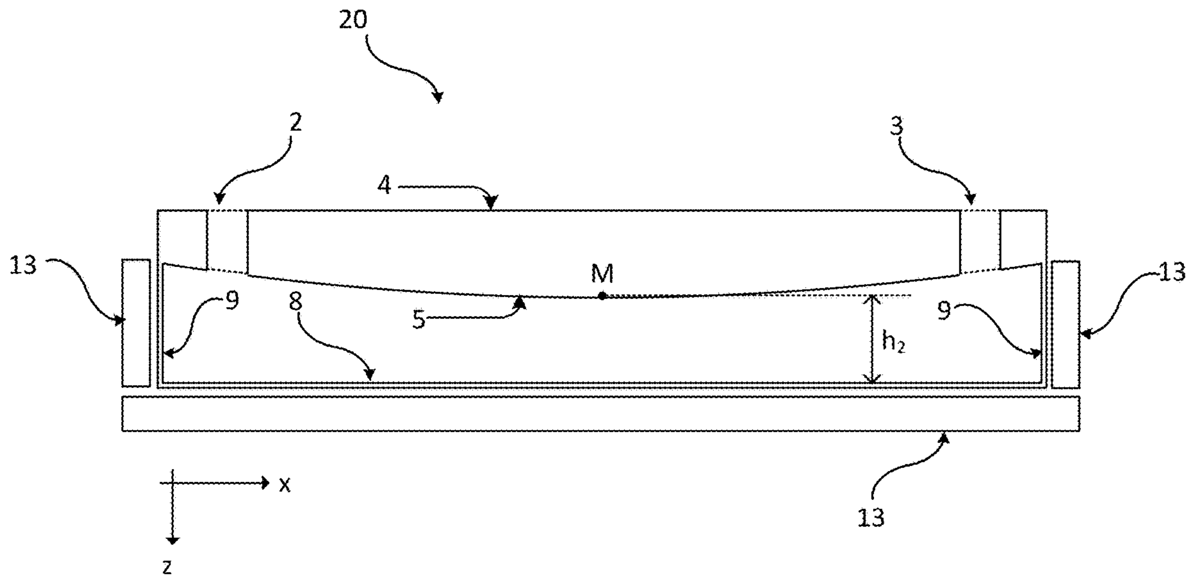
FIG. 13 is a cross-sectional view in a vertical plane of a vessel according to embodiments of the present invention comprising heating elements.

Referring to FIG. 13, in some embodiments, the vessel 20 may comprise heating element(s) 13 configured to heat the vessel 20 and/or its contents. The heating element(s) 13 may comprise one or more resistive heating elements for heating the vessel 20, which then transfers heat to the precursor 10. The heating element(s) 13 may comprise one or more inductive heating elements for directly heating the precursor 10. The heating element(s) 13 may comprise one or more thermoelectric elements. By heating a precursor 10 contained in the vessel 20, the vapor pressure of the precursor 10 may be increased in order to increase the amount of precursor vapor available to be drawn along with the carrier gas flow.

Embodiments of the present invention provide a method of providing a carrier gas which is substantially saturated with a precursor gas. The method may comprise the following steps. First, a vessel 20 according to embodiments of the present invention is provided. A precursor in solid or liquid form is provided in the vessel and distributed such that its surface is substantially flat. A carrier gas is flowed from the inlet port 2 to the outlet port 3. Flowing the carrier gas from the inlet port 2 to the outlet port 3 may comprise opening a valve upstream of the inlet port 2 so as to allow carrier gas to flow through the inlet port 2 into the vessel 20 and opening a valve downstream of the outlet port 3 so as to allow carrier gas and precursor gas to be drawn out of the vessel 20 through the outlet port 3. The inlet port 2 may be configured to be connected in fluid connection to a carrier gas supply line. The outlet port 3 may be configured to be connected in fluid connection to a gas line for delivery of precursor gas to, for example, a reaction chamber for processing one or more substrates. The outlet port 3 may be configured to be connected in fluid connection to a gas line for delivery of precursor gas to an accumulator vessel for collecting and storing precursor gas to be supplied in a controlled manner to a reaction chamber for processing one or more substrates.

The vessel may comprise one or more heating elements and the method may further comprise a step of heating the precursor vessel and/or the precursor contained therein before and/or during the step of flowing the carrier gas.

The vessel may comprise a resupply inlet for resupplying precursor in solid or liquid form to the vessel. This can help to maintain a relatively constant precursor surface height in the vessel. The inlet may be, for example, in the base of the vessel or a side wall of the vessel or a top surface or lid of the vessel. The method may further comprise a step of supplying precursor to the vessel in solid or liquid form through the resupply inlet.

The precursor may comprise one or more of $HfCl_4$, $ZrCl_4$, $MoCl_5$, Tetrakis(ethylmethylamido) zirconium (TEMAZr), Tetrakis(ethylmethylamido) hafnium (TEMAHf), Trimethylaluminium (TMA), Trimethylborate (TMB), Fluorotriethoxysilane (FTES), Tetrakis-dimethylamino Titanium (TDMAT), Tetrakis-diethylamino (TDEAT), CuTMVS, Diethylsilane, and/or Triethylphosphate (TEPO). The carrier may comprise nitrogen and/or argon.

The invention claimed is:

1. A vessel for containing a precursor in liquid or solid form, the vessel comprising an inlet port for supplying a gas to the interior of the vessel and an outlet port for removing a gas from the interior of the vessel, the inlet port and the outlet port being spaced apart in a first direction, the vessel comprising an upper interior surface and a bottom, opposite interior surface, the upper interior surface being arranged to face the precursor contained in the vessel in use, wherein the vessel is shaped such that a vertical distance between a top surface of the precursor and the upper interior surface of the vessel varies between the inlet port and the outlet port, having a minimum value at a point located between the inlet port and the outlet port in the first direction.

2. The vessel according to claim 1, wherein the minimum value point is located at a midpoint between the inlet port and the outlet port in the first direction.

3. The vessel according to claim 1, wherein the upper interior surface has a spherical shape.

4. The vessel according to claim 1, wherein the upper interior surface has a conical shape.

5. The vessel according to claim 1, the vessel being formed such that the vertical distance between a top surface of the precursor and the upper interior surface of the vessel increases along the first direction from the minimum value point towards the inlet port or the outlet port.

6. The vessel according to claim 5, the vessel being formed such that the vertical distance between the top surface of the precursor and the upper interior surface of the vessel increases in any direction directed away from the minimum value point.

7. The vessel according to claim 5, wherein the vertical distance increases continuously in any direction directed away from the minimum value point.

8. The vessel according to claim 5, wherein the vertical distance increases in a step-wise manner in any direction directed away from the minimum value point.

9. The vessel according to claim 1, wherein the upper interior surface comprises a flat section centered on the minimum value point, wherein the width of the flat section is less than two thirds the distance between the inlet port and the outlet port.

10. The vessel according to claim 1, wherein the width of the vessel is less than two times the distance between the inlet port and the outlet port.

11. The vessel according to claim 1, which is cylindrical in shape and wherein the minimum value point is located on the axis of the cylinder.

12. The vessel according to claim 1, comprising a receptacle for containing the precursor in solid or liquid form and a lid which is removably attached to the receptacle, wherein the upper interior surface of the vessel is a lower surface of the lid.

13. The vessel according to claim 12, wherein the inlet port and the outlet port are provided in the lid.

14. The vessel according to claim 1, wherein at least one of the inlet port and the outlet port has a slit shape, the width of the at least one of the inlet port and the outlet port being greater than its height.

15. The vessel according to claim 1, wherein at least one of the inlet port and the outlet port comprises a plurality of holes arranged in a slit shape.

16. The vessel according to claim 1, the vessel comprising side walls and a base, wherein a vertical distance between the upper interior surface of the vessel and the base of the vessel varies between a maximum and a minimum, and wherein the height of the side walls is between 1.5 times and ten times the difference between the maximum vertical distance and the minimum vertical distance.

17. The vessel according to claim 1, wherein a width of the vessel is at least ten times a height of the vessel.

18. The vessel according to claim 1, further comprising one or more heating elements for heating the vessel and/or a precursor when contained in the vessel.

19. A method of providing a carrier gas which is substantially saturated with a precursor gas, the method comprising providing a vessel according to claim 1, providing a precursor in solid or liquid form in the vessel, and flowing a carrier gas from the inlet port to the outlet port.

20. The method according to claim 19, wherein the vessel comprises one or more heating elements and the method comprises using the one or more heating elements to heat the precursor contained in the vessel before and/or while the carrier gas is flowed from the inlet port to the outlet port.

* * * * *